United States Patent [19]

Olshansky

[11] Patent Number: 4,766,597

[45] Date of Patent: Aug. 23, 1988

[54] SINGLE FREQUENCY SEMICONDUCTOR LASER AND DRIVE WITH REDUCED LINEWIDTH AND IMPROVED SIDE MODE SUPPRESSION

[75] Inventor: Robert Olshansky, Wayland, Mass.

[73] Assignee: GTE Laboratories Incorporated, Waltham, Mass.

[21] Appl. No.: 685,061

[22] Filed: Dec. 21, 1984

[51] Int. Cl.$^4$ .............................................. M01S 3/096
[52] U.S. Cl. ........................................ 372/44; 372/32; 372/33
[58] Field of Search ................. 372/43, 29, 26, 44, 372/33; 372/32, 38

[56] References Cited

U.S. PATENT DOCUMENTS

| 4,009,385 | 2/1977 | Sell | 372/26 |
| 4,340,966 | 7/1982 | Akiba | 372/45 |
| 4,461,007 | 7/1984 | Burnham | 372/45 |

OTHER PUBLICATIONS

W. Freude et al, "Inexpensive Equipment for Driving GaAs Lasers With 100 ps Risetime Pulses", *Electronics Letters*, vol. 12, No. 22, pp. 598–599 Oct. 1976.
R. A. Linke, Electronics Letters, 20:472 (1984).
Mito et al., Electronics Letters 20:261 (1984).
Linke et al., Conf. Optical Fiber Comm., New Orleans (Jan. 1984).
Koyana et al., J. Quantum Elect., 19:1042 (1983).
Midwinter, Opt. Quantum Elect., 9:299 (1977).

*Primary Examiner*—James W. Davie
*Attorney, Agent, or Firm*—Ernest V. Linek

[57] ABSTRACT

By driving a semiconductor laser with a current pulse having an optimized shape, the relaxation oscillations of the laser are greatly suppressed. This leads to significantly reduced frequency chirping and improved side mode suppression. The pulse broadening normally produced by 100 km of single-mode fiber can be completely compensated by driving the laser with the optimized current pulse. This invention can be applied to any type of single frequency laser including DFB, C$^3$, and the like.

1 Claim, 6 Drawing Sheets

OPTIMIZED TWO STEP CURRENT PULSE

CARRIER DENSITY OSCILLATIONS FOR 200 μm LASER
DRIVEN BY STANDARD CURRENT PULSE

PHOTON DENSITY OSCILLATIONS FOR 200 μm LASER
DRIVEN BY STANDARD CURRENT PULSE

SUPPRESSED CARRIER DENSITY OSCILLATIONS PRODUCED BY OPTIMIZED CURRENT PULSE SHOWN IN FIG.2

PHOTON DENSITY PULSE PRODUCTED BY OPTIMIZED CURRENT PULSE SHOWN IN FIG.2

CARRIER DENSITY OSCILLATIONS FOR 40μm LASER
DRIVEN BY STANDARD CURRENT PULSE

PHOTON DENSITY OSCILLATIONS FOR 40μm LASER
DRIVEN BY STANDARD CURRENT PULSE

OPTIMIZED TWO STEP CURRENT PULSE FOR 40μm LASER

SUPPRESSED CARRIER DENSITY OSCILLATIONS OBTAINED FOR 40μm LASER DRIVEN BY OPTIMIZED CURRENT PULSE SHOWN IN FIG. 9

PHOTON DENSITY OSCILLATIONS OBTAINED FOR 40 μm LASER

SINGLE FREQUENCY SEMICONDUCTOR LASER AND DRIVE WITH REDUCED LINEWIDTH AND IMPROVED SIDE MODE SUPPRESSION

BACKGROUND OF THE INVENTION

The present invention is directed to semiconductor lasers. More particularly, the present invention is directed to a method for improving a single frequency semiconductor laser comprising driving said laser with an optimized current pulse.

Fiber optical communication systems operating at 1.5 μm over long distances with non-dispersion shifted fibers require single frequency lasers with narrow linewidths and strong side mode suppression. If a laser is biased at, or slightly above, threshold and pulse code modulated at high data rates (over several hundred megabits/sec) with the usual type of current pulse, severe oscillations of the injected carriers are produced. This is the well-known relaxation oscillation phenomenon which is predicted by the semiconductor laser rate equations.

The relaxation oscillations of the injected carrier density produce two undesirable effects in lasers which are designed for single frequency transmission: (1) the oscillations produce increased optical power in the side modes, which leads to mode partition noise in the communication system; (2) the oscillation of the carrier density produces oscillation in the center frequency of the lasing line, which causes increased pulse dispersion. It has recently been shown that in a single frequency cleaved couple cavity ($C^3$) laser operating at 1 Gb/s over a distance of 120 km a 5.6 dB powder penalty resulted from the increased width of the laser line. See for example, R. A. Linke, *Electronics Letters*, 20: 472 (1984). Similar effects have been observed in distributed feedback (DFB) lasers. See for example, I. Miro et al., *Electronics Letters*, 20: 261 (1984).

SUMMARY OF THE INVENTION

This invention is directed to improve single frequency semiconductor lasers driven by a current pulse having a multiple, e.g., double, triple, quadruple, and the like, step turn-on. Preferably, the current pulse has a double step turn-on. By employing such a current pulse, the relaxation oscillations normally encountered in such lasers can be greatly reduced or eliminated.

By introducing an improved current pulse having a two step turn-on characteristic the carrier density oscillations can be reduced by a factor of 3 or more. The use of current pulses having greater than a double step turn-on characteristic, is expected to demonstrate even greater reduction in carrier density oscillations.

This reduction in carrier density oscillation can be implemented in any type of semiconductor laser, and is particularly useful in single frequency semiconductor lasers such as distribution feedback (DFB) lasers, cleaved coupled cavity ($C^3$) lasers, and short cavity (SC) lasers, with and without external reflectors.

DETAILED DESCRIPTION OF THE PREFERRED EMBODIMENTS

Figure 1:
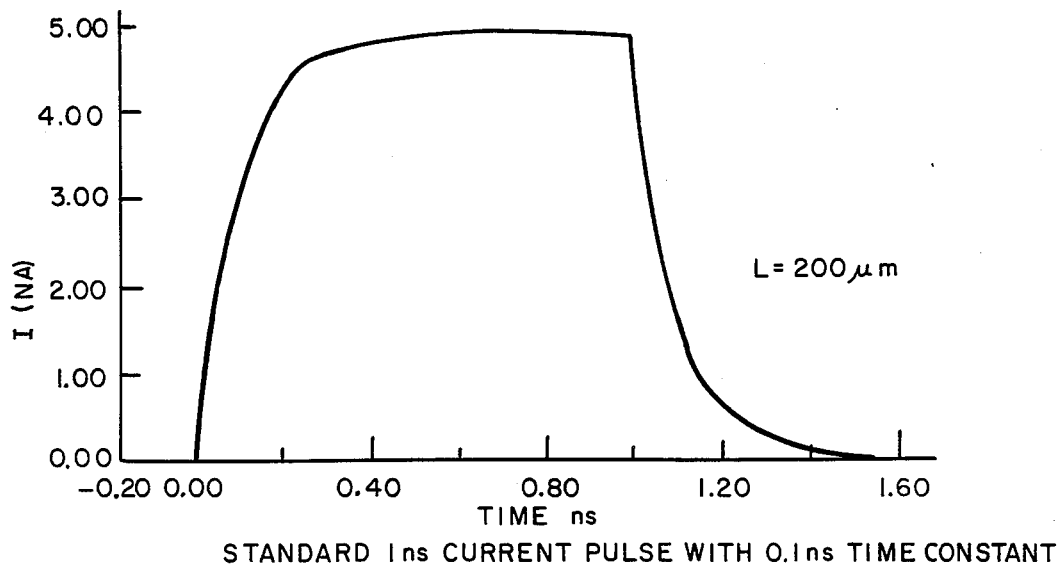
FIG. 1 shows a typical (prior art) 1 nsec current pulse which has a 0.1 nsec time constant for the exponential rise and fall times.

The present invention is directed to a method for improving the performance of single frequency semiconductor lasers, by driving said lasers with an optimized multiple, for example, double step turn-on current pulse.

It is clear from the examples which follow that considerable improvement in laser characteristics are obtained by introducing a shaped current pulse which reduces the oscillation of the injected carrier density. It is also clear that as electronic technology improves that even more sophisticated current pulses can be introduced which will lead to even further improvements. The semiconductor laser rate equations have been used to show that for an ideally shaped current pulse the relaxation oscillation can be completely removed.

High data rate optical communication systems operating at 1.5 μm over long distances require single longitudinal mode laser sources having dynamic linewidths of less than 1 angstrom to prevent dispersion induced degradation in system performance. Broadening of the linewidth of a $C^3$ laser, caused by relaxation oscillations of the injected carrier density, has been reported to cause a 5.6 dB power penality in a 1 Gb/s transmission experiment over a distance of 120 km, and larger power penalties will occur at higher data rates. See for example, Linke et al., Post Deadline Paper WJ7, *Conf. Optical Fiber Comm.*, New Orleans (January 1984), and Linke, *Elec. Lett.*, supra. Distributed feedback (DFB) lasers also exhibit broadened linewidths when modulated at gigabit rates. DFB linewidths appear to increase in proportion to the modulation speed, with a 2 Gb/s PCM signal producing a 2 angstrom linewidth. See for example, Koyana et al., *J. Quantum Elec.*, 19: 1042 (1983), and Mito et al., *Elec. Lett.*, supra.

The semiconductor laser rate equations are given by:

$$dn/dt = I(t)/ev - B_T n^2 - \Sigma g_i S_i \quad (1)$$

$$dS_i/dt = (g_i + \alpha)S_i + \gamma B_o(n)n^2 \quad (2)$$

where the following definitions are used:
I(t): Injected carrier density
$S_i(t)$: Photon density mode i
e: electronic charge
v: cavity volume
$B_T$: Total recombination coefficient
$g_i$: Gain in mode i
$\alpha$: Total cavity loss
$\gamma$: Spontaneous emission factor
$B_o(n)$: Radiative recombination coefficient These equations can be solved numerically for an arbitrary shaped current pulse I(t) using standard routines for solving differential equations. Additional calculations may then be used to find the current pulse shapes which minimize the oscillations of the injected carrier density.

It has been discovered that if the photon density from the laser driven by an optimized current pulse is allowed to propagate over 100 km of single-mode fiber having dispersion of 15 ps/km/nm that the output pulse width is the same as the pulse width obtained directly from a laser driven by the normal current pulse. In other words, the effect of the optimized drive current completely compensates for the dispersion caused by 100 km of fiber.

In the first example, a 200 μm cavity length laser with normal front facet reflectivity ($R_1=0.3$) and high rear facet reflectivity ($R_2=1.0$) is considered. While such a device is not normally used for applications requiring a stabilized single mode source, its relaxation frequency and dynamic line broadening are comparable to those observed in typical DFB lasers. The response of the laser is calculated both for the standard drive current pulse (FIG. 1a) and for the optimized drive pulse shown in FIG. 2a. The parameters of the optimized pulse are chosen by varying the relative amplitude of the prepulse $x_o = I/i_p$ and its duration $t_o$ to minimize the rms carrier density oscillation $\sigma_n$, defined as $$\sigma_n = [(\delta n^2) - (\delta n)^2]^{\frac{1}{2}} \quad (3)$$

$$\overline{(\delta n^p)} = \int_o^{T(1ns)} dt S_o(t)[\delta n(t)]^p / \int_o^{T(1ns)} dt S_o(t) \quad (4)$$

where the time averages are performed using the photon density $S_o(t)$ as a weighting function over the time interval T. The overall amplitude of the main current pulse is adjusted so that the same total photon density per bit which results from the optimized drive pulse is the same as that obtained with the standard drive pulse.

The responses of the carrier densities and the photon densities arising from normal and the optimized drive current pulses are shown in FIGS. 1a–b and FIGS. 2a–b. Comparison of FIGS. 1a and 2a shows that the optimized current pulse significantly reduces the amplitude of the carrier density relaxation oscillations. The value of $\sigma_n$ has been reduced from $3.3 \times 10^{16}/cm^3$ to $1.2 \times 10^{16}/cm^3$. The values of the parameters $x_o$ and $t_o$, found by a standard minimization routine, are 0.21 and 0.52 nsec, respectively. The dynamic line broadening $\sigma$ can be calculated from the equation $$\sigma = \lambda \Gamma \sigma_n l / N dN/dn \quad (5)$$

where N is the refractive index and dN/dn is $-2.8 \times 10^{-20}$ cm$^3$. One finds that the standard drive pulse produces an rms broadening $\sigma$ of 1.4 angstroms, and that this is reduced to 0.5 angstroms by the optimized pulse shape.

While not wishing to be bound by theory, the physical mechanism responsible for the reduction in relaxation oscillations appears to be clear. The amplitude of the initial current pulse is reduced to minimize the large overshoot in carrier density which normally occurs at turn-on. The position of the leading edge of the second current pulse is positioned at time $t_o$ to catch the carrier density oscillation before it undershoots the steady state value.

EXAMPLE 1

Figure 2:
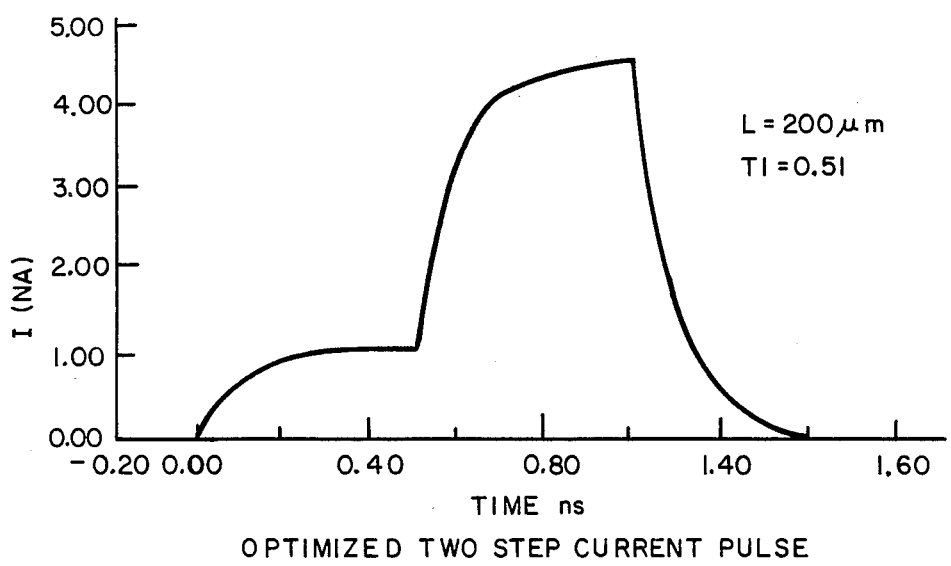
FIG. 2 illustrates one optimized double step current pulse of the present invention.
Figure 3:
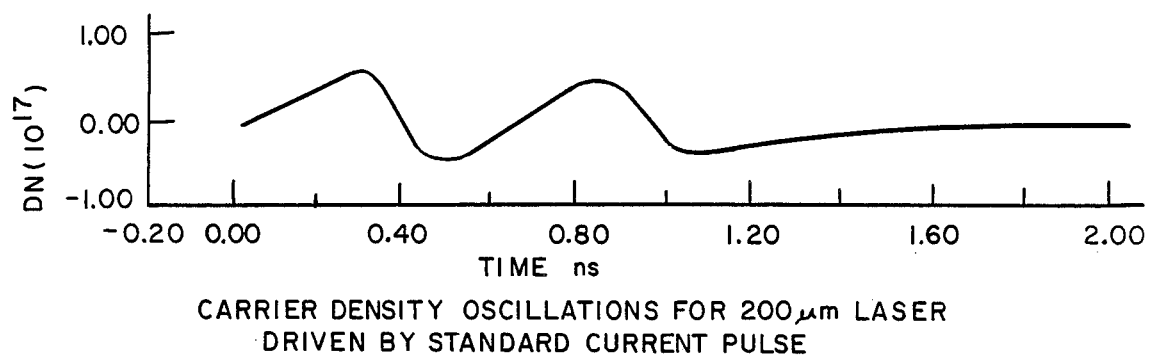
FIG. 3 illustrates the carrier density oscillations of the device of example 1 driven under standard (prior art) conditions.

The response of a laser with 200 μm cavity length and normal facet reflectivity (0.3) was studied. First the carrier density and photon density oscillations were calculated for response to a 1 ns current pulse having a rise time and fall time of 0.1 nsec (FIG. 1). The corresponding oscillations of the carrier density and photon densities are shown in FIGS. (3) and (4). To reduce the oscillations a modified current pulse was used with a double step turn-on (FIG. 2). The amplitude of the step, $x_1$, and width of the step, $t_1$, were optimized with a minimization routine. For the optimal values of $x_1 = 0.21$ and $t_1 = 0.52$ nsec the reduced carrier and photon oscillations were calculated as shown in FIGS. (5) and (6).

With the normal current pulse $\sigma_n = 3.4 \times 10^{16}/cm^3$ while for the optimized pulse the rms variation has been reduced to $1.2 \times 10^{16}/cm^3$. This represents a factor of 2.8 improvement.

EXAMPLE 2

Figure 10:
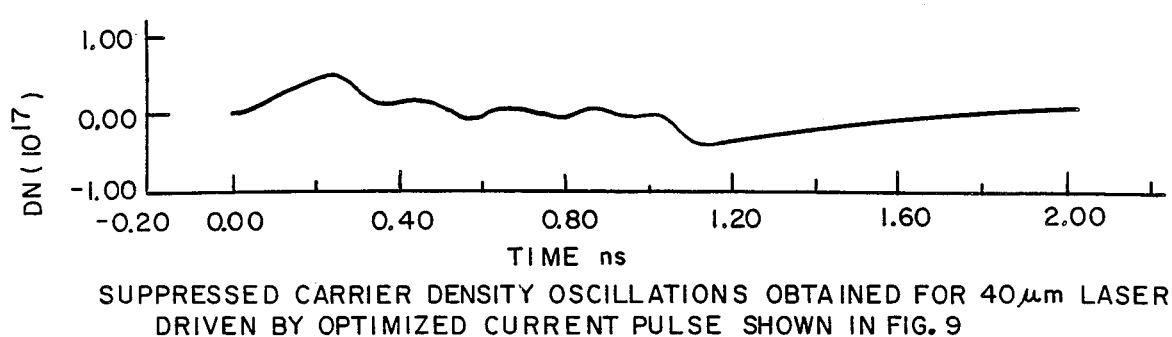
FIG. 10 illustrates the reduced photon density oscillations of the device of example 2 when driven by a double step current pulse of the present invention.
Figure 11:
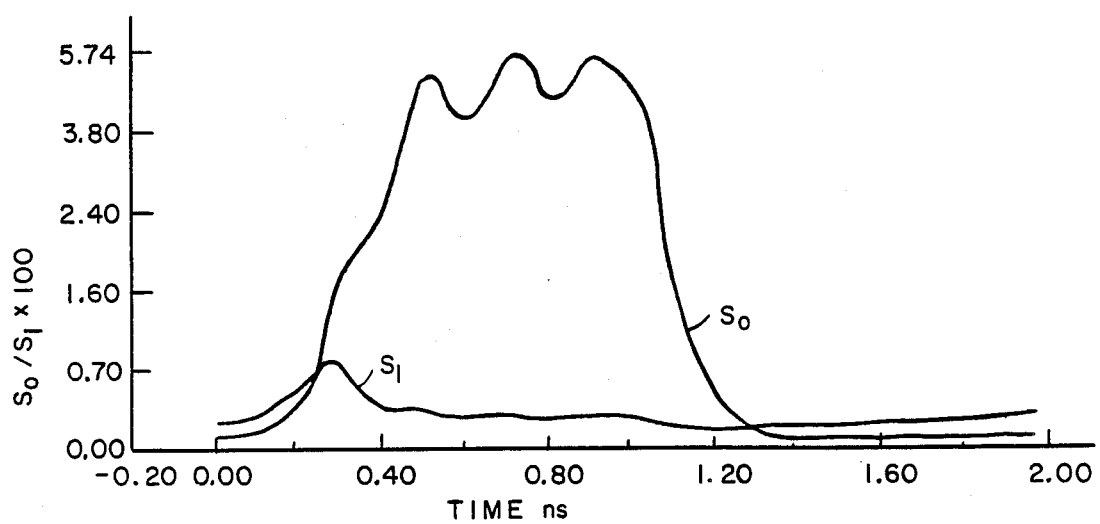
FIG. 11 illustrates the increase in side mode suppression ratio for the device of example 2 when driven by the optimized pulse (FIG. 2) of this invention.

In this example, a short cavity (L=40 μm) device with R=0.8 is considered. With the normal 1 nsec pulse having 0.1 nsec rise and fall times the rms carrier density variation is $5.6 \times 10^{16}/cm^3$. The carrier density and photon density oscillations are shown in FIGS. (7) and (8). For the double step current pulse (FIG. 9) with $x_1 = 0.17$ and $t_1 = 0.31$ nsec the rms variation $\sigma_n$ is reduced to (FIG. 10) $1.5 \times 10^{16}/cm^3$ representing a factor of 3.7 improvement. The side mode suppression ratio (FIG. 11) is also increased by the introduction of the optimized drive pulse. The side mode suppression ratio is increased from 311 with the normal pulse to 650 for the optimized pulse.

Practical realization of these pulse shapes is not unrealistic. The most critical parameter to control is the delay time between the two parts of the current pulse. Numerical calculation indicates that a ±40 psec deviation in $t_o$ produces only a 20% increase in $\sigma_n$. On the basis of the teachings of the present invention, it is believed that those skilled in the art will be able to build this type of delay into any drive circuit without great difficulty.

Figure 12:
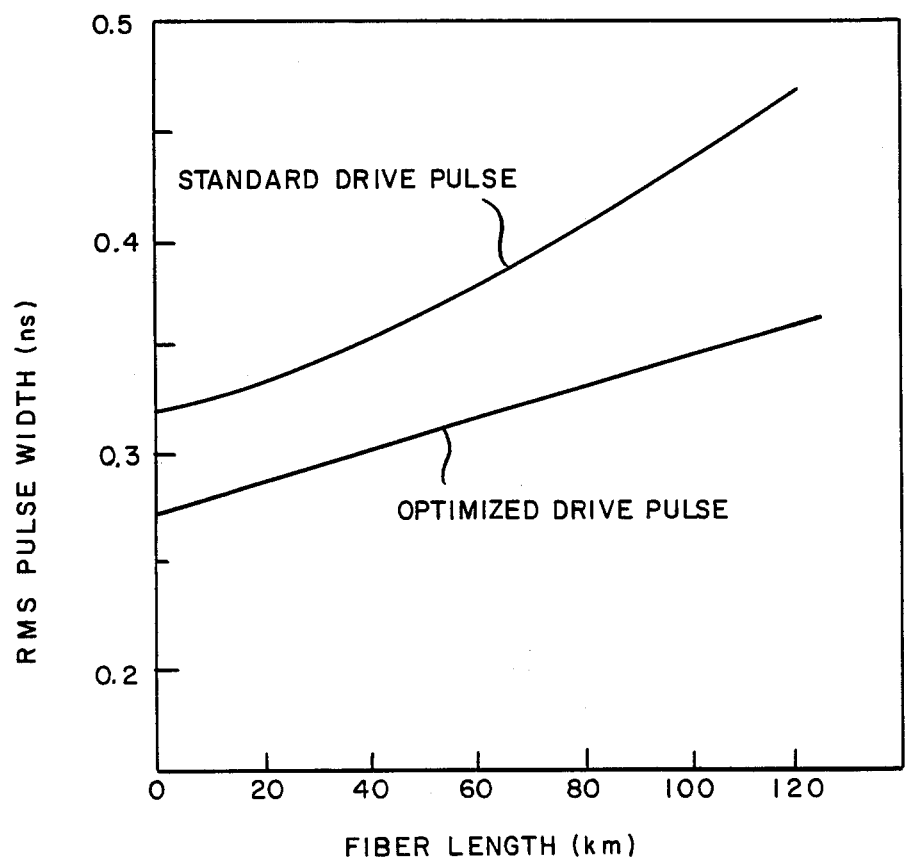
FIG. 12 illustrates the rms optical pulse width as a function of fiber length for the two different drive pulses, prior art (standard) and the double step current pulse of the present invention (optimized).

It is also important to consider the effect of the optimized current pulse after the photon pulse has propagated over a length of single-mode fiber having dispersion of 15 ps/km/nm. FIG. 12 shows the rms optical pulse width as a function of fiber length for the two different drive pulses.

Figure 4:
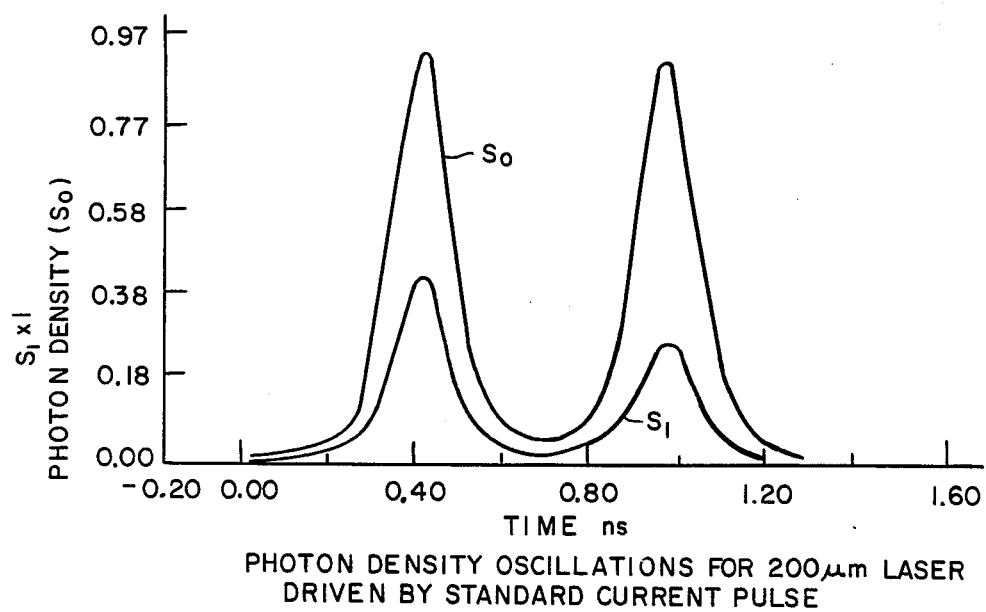
FIG. 4 illustrates the photon density oscillations of the device of example 1 driven under standard (prior art) conditions.
Figure 5:
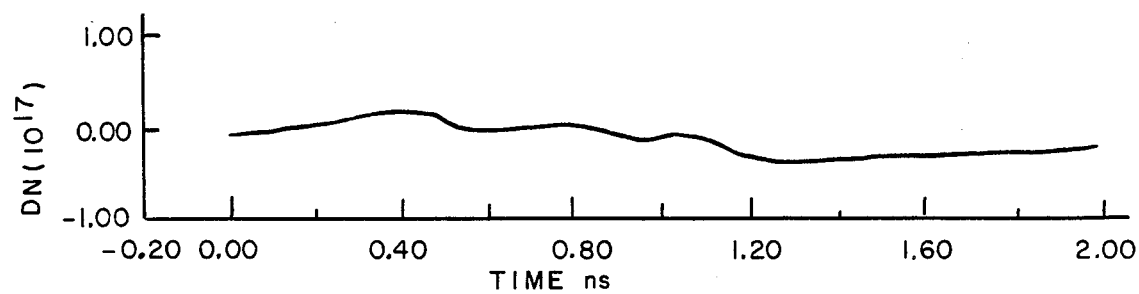
FIG. 5 illustrates the reduced carrier oscillations of the device of example 1 when driven by a double step current pulse of the present invention.
Figure 6:
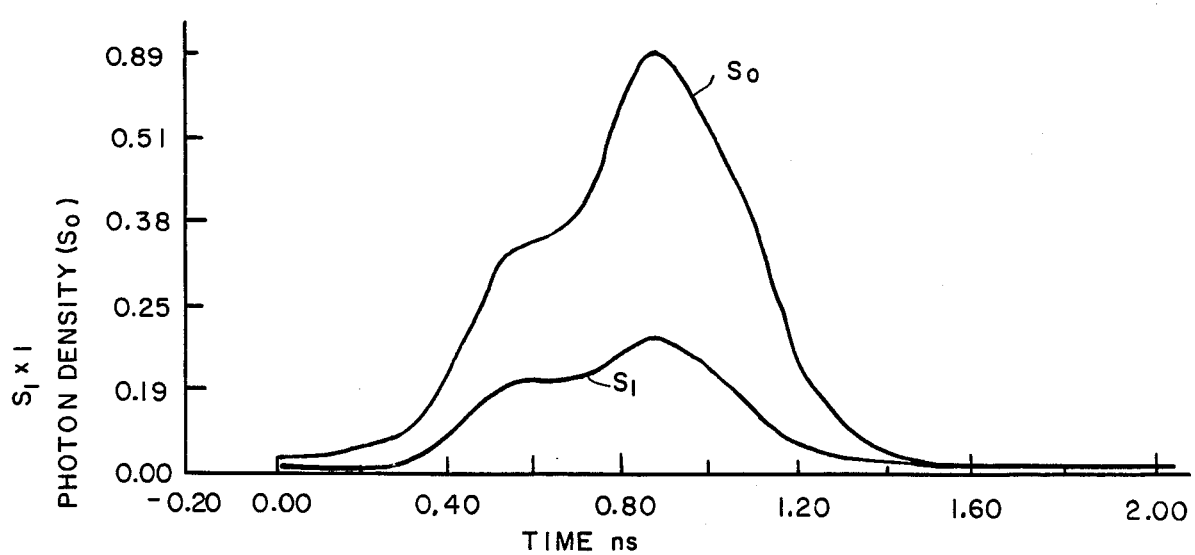
FIG. 6 illustrates the reduced photon oscillations of the device of example 1 when driven by a double step current pulse of the present invention.
Figure 7:
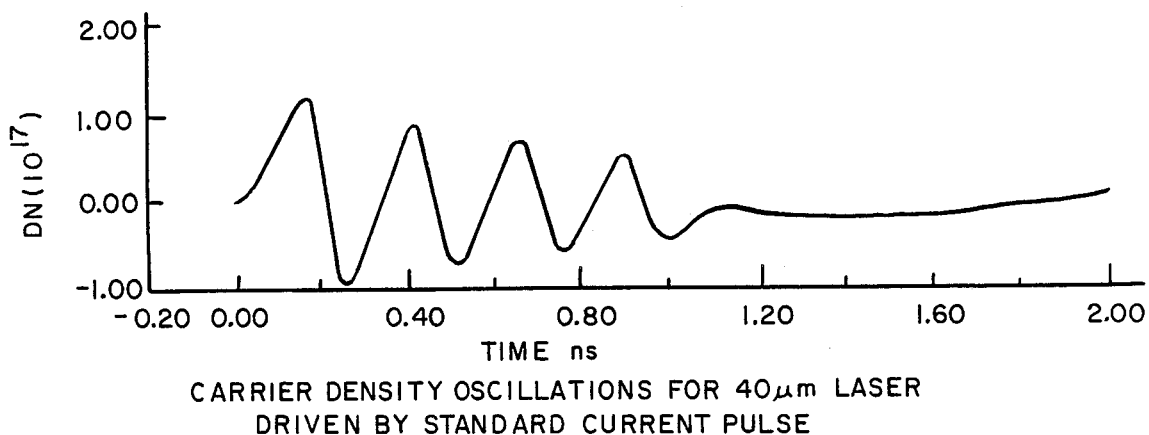
FIG. 7 illustrates the normal (prior art) carrier density oscillations of the device of example 2 driven under standard conditions.
Figure 8:
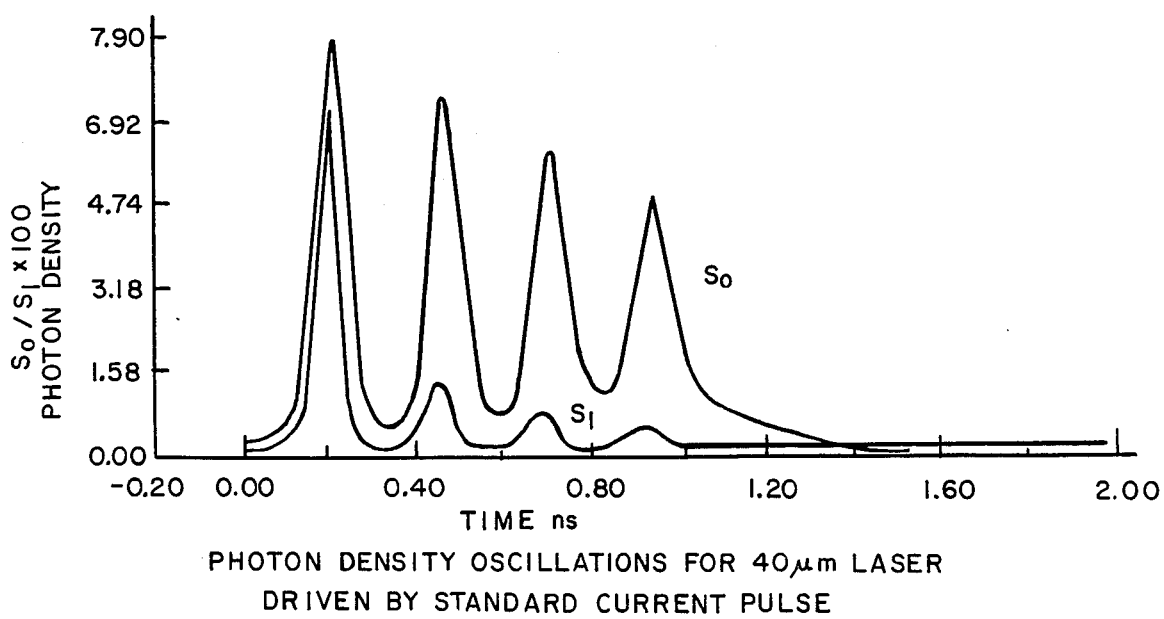
FIG. 8 illustrates the normal (prior art) photon density oscillations of the device of example 2 driven under standard conditions.

Two advantages accrue from using the optimized drive pulse of the present invention. The initial rms pulse width is narrower and the rate of pulse broadening is lower. After 100 km of propagation the optimized drive pulse leads to an optical pulse width of 0.34 nsec as compared to 0.43 nsec for the standard drive pulse. The power penalty can be estimated from the fraction of power which has left the bit interval, and is shown in FIG. 4. See, Linke, *Elec. Lett.*, supra, and Midwinter *Opt. Quantum Electron.*, 9: 299 (1977). For a 100 km fiber length, the power penalty from dynamic line broadening is reduced from 3.7 to 1.0 dB by use of the present drive pulse.

Even greater reduction in the relaxation oscillations can be achieved with more finely controlled pulse shapes. In fact it is possible to eliminate relaxation oscillations completely. Suppose one desired to produce a smooth, non-oscillating photon pulse $s_f(t)$. By inserting this pulse shape into the photon density rate equation, Eq. (2), one can calculate the carrier density $n_f(t)$ required to produce $S_f(t)$. Eq. (1) can then be used to calculate the required current pulse $I_f(t)$ which would produce no relaxation oscillations. This is useful in that it shows that relaxation oscillations are not intrinsic features of high data rate modulations. Relaxation oscillations are merely a consequence of using current pulses having poorly shaped leading edges.

The present invention has been described in detail, including the preferred embodiments thereof. However, it will be appreciated that those skilled in the art, upon consideration of the present disclosure, may make modifications and improvements on this invention and still be within the scope and spirit of this invention as set forth in the following claims.

Figure 9:
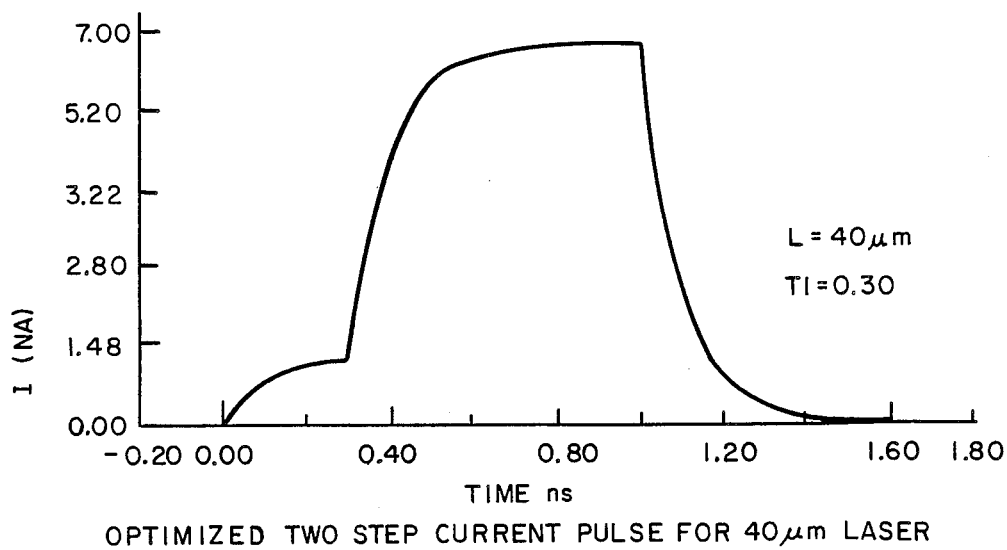
FIG. 9 illustrates the optimized two step current pulse for a 40 μm laser.

What is claimed is:

1. In the method of operating a single frequency laser, selected from the group of distributed feedback, coupled cavity and short cavity lasers, with and without external reflectors;

the improvement comprising:

driving said laser with a current pulse having a double step turn-on, thereby suppressing relaxation oscillations; wherein the current pulse has the optimized shape illustrated in FIG. 2 or FIG. 9.

* * * * *